(12) United States Patent
Ogami et al.

(10) Patent No.: US 6,901,563 B1
(45) Date of Patent: May 31, 2005

(54) STORING OF GLOBAL PARAMETER DEFAULTS AND USING THEM OVER TWO OR MORE DESIGN PROJECTS

(75) Inventors: Kenneth Y. Ogami, Bothell, WA (US); Marat Zhaksilikov, Snohomish, WA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 09/989,761

(22) Filed: Nov. 19, 2001

(51) Int. Cl.⁷ .............................................. G06F 17/50
(52) U.S. Cl. ................................ 716/2; 716/1; 716/16; 716/17
(58) Field of Search ........................... 716/1, 2, 16, 17, 716/11, 4; 717/124; 705/3.2; 703/23

(56) References Cited

U.S. PATENT DOCUMENTS

| | | | | |
|---|---|---|---|---|
| 5,155,836 A | * | 10/1992 | Jordan et al. ................. | 703/23 |
| 5,479,643 A | * | 12/1995 | Bhaskar et al. ............. | 717/124 |
| 6,321,369 B1 | * | 11/2001 | Heile et al. .................... | 716/11 |
| 6,587,995 B1 | * | 7/2003 | Duboc et al. ................... | 716/4 |
| 2002/0174134 A1 | * | 11/2002 | Goykhman ................... | 705/32 |

* cited by examiner

Primary Examiner—Thuan Do
(74) Attorney, Agent, or Firm—Murabito & Hao LLP

(57) ABSTRACT

A system and method for graphically displaying global resources and their associated parameter values and apply the global resources across multiple design projects. The system and method also provide a graphical interface which displays the possible parameter values of an associated global resource. This graphical interface utilizes pop up menu to for viewing the possible parameter values and the selection of the current parameter value. The system and method also provide tracking and updating of the hardware resources which utilize the parameter values of the global resources. Further, the system also allows the storage of these parameters values of the global resources. By storing these parameter values of the global resources, these parameter values can be set as default global settings. These default global settings can be recalled and associated with different projects without manual entry of the parameter values.

28 Claims, 8 Drawing Sheets

STORING OF GLOBAL PARAMETER DEFAULTS AND USING THEM OVER TWO OR MORE DESIGN PROJECTS

RELATED APPLICATIONS

U.S. patent application Ser. No. 10/033,027, entitled "PROGRAMMABLE MICROCONTROLLER ARCHITECTURE," filed on Oct. 22, 2001, and with inventor Warren Snyder is hereby incorporated by reference.

FIELD OF THE INVENTION

The invention relates generally to the field of circuit design applications, more particularly to a system and method for selecting and storing global parameters.

BACKGROUND OF THE INVENTION

It is often useful to utilize circuit design application software to layout and plan new integrated circuits. This circuit design application software is typically configured to aide the user in keeping track of resource requirements of particular modules. Furthermore, circuit design application software also allows users to assign circuit resources to particular modules.

However, circuit design software applications typically have minimal graphical support. They usually are not capable of supplying the user with a graphical display representing a current status of the layout of the resources on a chip. Chip designers are typically required to manually and textually track their layout decisions with minimal graphical support.

Furthermore, selection of global parameters such as clock speed, phase locked loop mode, and the like were set by manually writing application programming interfaces to provide these settings and parameters. The process of writing application programming interfaces is often times error-prone and requires knowledge of many low level technical requirements and requires many manual steps. For example, users typically need to find register information on the data sheet for particular hardware elements in order to properly set the register. In addition, since the global parameters effect many elements within the hardware, the application programming interfaces can become very long and complex. Moreover, once written, the global parameter settings are applicable only to the project for which they were developed. In order to establish the global parameters for another project, they have to be manually reprogrammed.

SUMMARY OF THE INVENTION

It is useful to provide a circuit designer with a circuit design application software that allows the viewing, selection, and storage of global parameter values through a simplified user interface. For example, being able to graphically display the current global parameter values and possible global parameter values would be useful. Further, being able to graphically select a global parameter value from the possible global parameter values would also be beneficial. Further, being able to store a set of default global parameter settings which can be recalled and associated with different projects would be beneficial.

A system and method are described for graphically displaying global resources and their associated parameter values and applying them over multiple design projects. The system and method also provide a graphical interface which displays the possible parameter values of an associated global resource. This graphical interface utilizes a pop up menu for viewing the possible parameter values and the selection of the current parameter value. The system and method also provide tracking and updating of the hardware resources which utilize the parameter values of the global resources. Further, the system also allows the storage of these parameters values of the global resources. By storing these parameter values of the global resources, these parameter values can be set as default global settings. These default global settings can be readily recalled and associated with different projects without manual entry of the parameter values. Therefore, a set of predefined and saved global parameter defaults can be associated with multiple projects by merely causing a name associated with the default global parameters to be associated with the new project.

In one embodiment, the global parameters can be presented on a display screen in a tabular form with parameter name and the associated default or current setting shown next to the parameter name. The user can change the value of the parameter by selecting the displayed value with a cursor control device. A pop up window can then be used to select a new value. The values selected in the tabular display are then applied to the user's integrated circuit design. Alternate integer entry is provided for numeric inputs. Direct number entry or spinner control with min/max checking is allowed, e.g., 24V1=24 MHz/N and 24V2=24 V1/N. Storage of these values for global resources allows different projects to adopt the same default global settings. In effect, the default global parameter settings can be given a name and then associated with various projects without the user having to separately enter (or remember) each setting value. An on-screen selection can be used to recall the default global settings and then apply them to a particular project.

More specifically, in a design system for programming integrated circuits, an embodiment of the present invention is drawn to a method of processing global design parameters comprising: a) displaying, in tabular form, a list of global design parameters and respective global design parameter values associated therewith for a first design project; b) in response to a user selection of a selected global design parameter, displaying a window comprising a plurality of possible values for the selected global design parameter; c) in response to a user selection of a selected value of the possible values, assigning the selected global design parameter to the selected value; d) saving the selected global design parameter; and applying said global design parameters and parameter values to a second design project.

Embodiments include the above and further comprising: selecting the selected global design parameter; and selecting the selected value wherein the selectings are performed using a cursor control device.

Embodiments include the above and further comprising: updating a memory resident database comprising the global design parameters and associated values; and propagating the global design parameters and associated values across a user circuit design for an integrated circuit to be programmed.

Embodiments include the above and wherein the integrated circuit to be programmed is a programmable microcontroller circuit and wherein the window comprises a pop-up list.

Other aspects and advantages of the invention will become apparent from the following detailed description, taken in conjunction with the accompanying drawings, and illustrated by way of example of the principles of the invention.

DETAILED DESCRIPTION

Specific reference is made in detail to the embodiments of the invention, examples of which are illustrated in the accompanying drawings. While the invention is described in conjunction with the embodiments, it will be understood that the embodiments are not intended to limit the scope of the invention. The various embodiments are intended to illustrate the invention in different applications. Further, specific details are set forth in the embodiments for exemplary purposes and are not intended to limit the scope of the invention. In other instances, well-known methods, procedures, and components have not been described in detail as not to unnecessarily obscure aspects of the invention.

Figure 1:
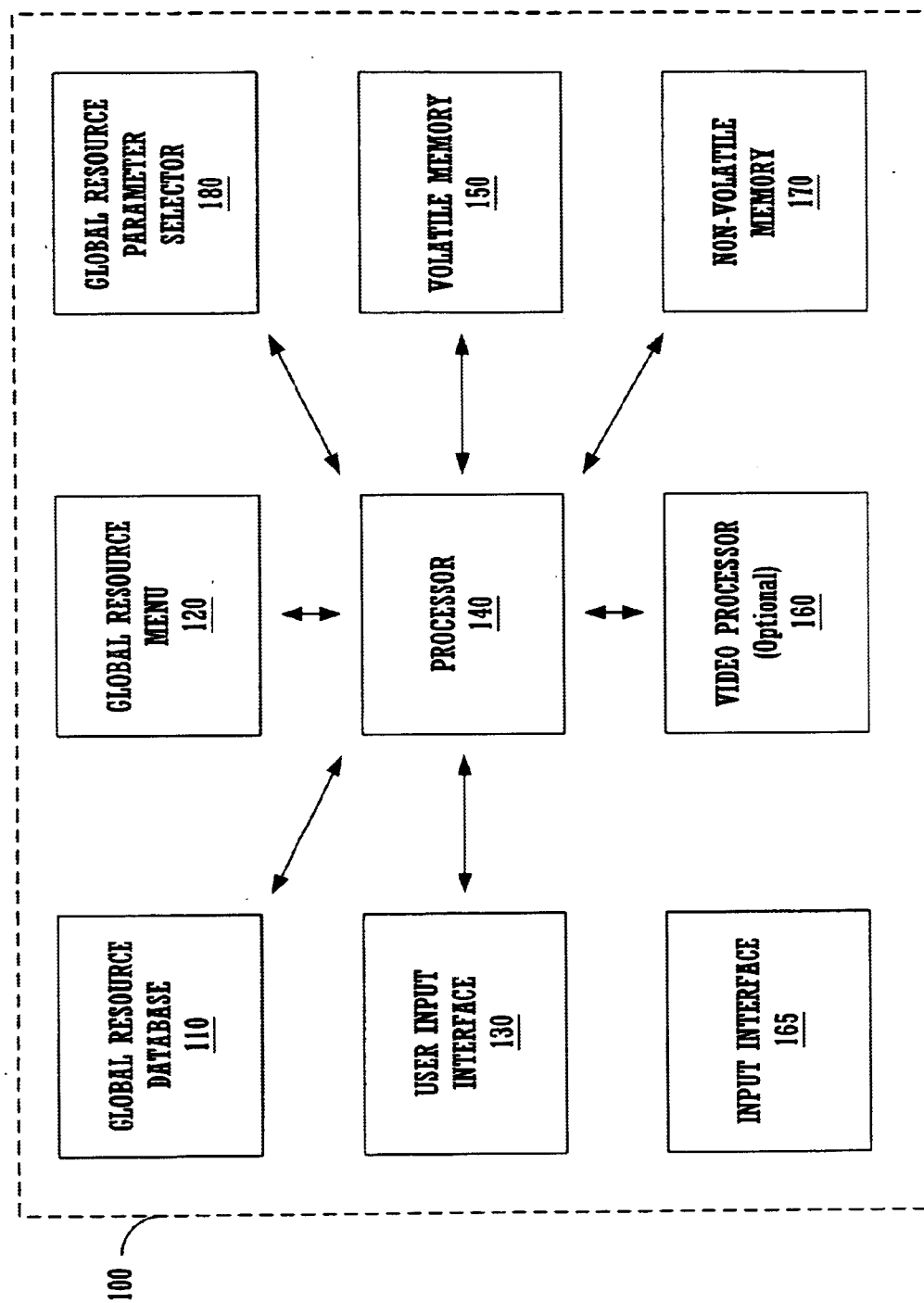
FIG. 1 illustrates a system in accordance with the invention.

With reference to FIG. 1, a computer system 100 for viewing and selecting a global resource parameter value according to the invention is shown. The system 100 operates within a chip design software application to graphically display the current parameter value of a global resource within a window and the possible parameter values for this global resource within a pop up window. In one embodiment, the current parameter value of the global resource is displayed within a global resource window which contains a plurality of global resources and their associated parameter values. In one embodiment, the information is displayed in a tabular form. Further, the system 100 also provides the ability to select the parameter value for the global resource by highlighting the parameter value from a plurality of possible parameter values displayed within a pop up window. Further, the system 100 also provides the ability to store multiple selected parameter values as the default global settings. The default global settings can then be recalled and associated with various other projects without the user having to separately enter or select each parameter value.

The system 100 includes a processor 140, an input interface 130, volatile memory 150, an optional video processor 160, and non-volatile memory 170. The user input interface 130 (e.g., a cursor directing device and a keyboard), the volatile memory 150, the video processor 160, and the non-volatile memory 170 are connected to the processor 140. The input interface 130, the processor 140, the volatile memory 150, the video processor 160, and the non-volatile memory 170 are components that are readily found in personal computer systems.

The system 100 further includes a global resource database 110, a global resource menu 120, and a global resource parameter selector 180, which are also connected to the processor 140. The components 110, 120, and 180 are merely illustrated in FIG. 1 as one embodiment of the system 100. Although the components 110, 120, and 180 are illustrated in FIG. 1 as separate components of the system 100, two or more of these components may be integrated, thus decreasing the number of components in the system 100. Similarly, the components 110, 120, and 180 may also be separated, thus increasing the number of components within the system 100. The components 110, 120, and 180 may be implemented in any combination of hardware, firmware and software.

In one embodiment, the system 100 helps users more accurately and efficiently program a programmable integrated circuit device. The system 100 allows the global resources and their associated parameter values to be viewed and modified. Further, the system 100 also graphically allows the possible parameter values of the global resource to be displayed. Additionally, the actual parameter value can be selected from the group of possible parameter values for modifications thereof.

Additional tracking and programming to effectuate changes in the parameter values of the global resources are performed automatically by the system 100.

In one embodiment, the system 100 is configured to support programmable microcontroller design. In yet another embodiment, the system 100 supports general chip design.

The input interface 165 provides a means for the system 100 to receive user input which may include selection of various user module and resources and command sequences. The input interface 165 may be a USB port, a serial port, Ethernet port, or any other interface port configured to transmit electronic data to the system 100.

The video processor 160 provides graphical output from the system 100. The video processor 160 is configured to display the global resources, the parameter values of the global resources, and the menu displaying the possible parameter values for a global resource.

The global resource database 110 tracks data stored within the specific locations of the various hardware resources which are affected by individual global resources. In one embodiment, the resource global resource database 110 tracks the locations of specific registers relating to hardware resources for maintaining the correct global resource parameter value associated with a specific hardware resource.

The global resource menu 120 generates graphical information which displays a global resources window. This global resources window includes the display of the global resources and the associated parameter values. In one embodiment, the information can be presented in a tabular form. The global resource menu 120 also generates graphical information which displays a pop up menu that shows the possible parameter values associated with a specific global resource. In one embodiment, the global resource menu 120 is configured to provide the possible parameter values associated with the specific global resource and provide shading or highlighting of one of the possible parameter values prior to selection by a user.

Alternate integer entry is provided for numeric inputs. Direct number entry or spinner control with min/max checking is allowed, e.g., 24V1=24 MHz/N and 24V2=24 V1/N.

The global resource parameter selector 180 accepts the specific global resource parameter value in response to the graphical information from the global resource menu 120. Further, the global resource parameter selector 180 communicates with the global resource database 110 and records this specific global resource parameter value in the appropriate registers of the hardware resources. Further, the global resource parameter selector 180 also provides the ability to store multiple selected parameter values as the default global settings. The default global settings can then be recalled and associated with various other design projects without the user having to separately enter or select each parameter value.

Figure 2A:
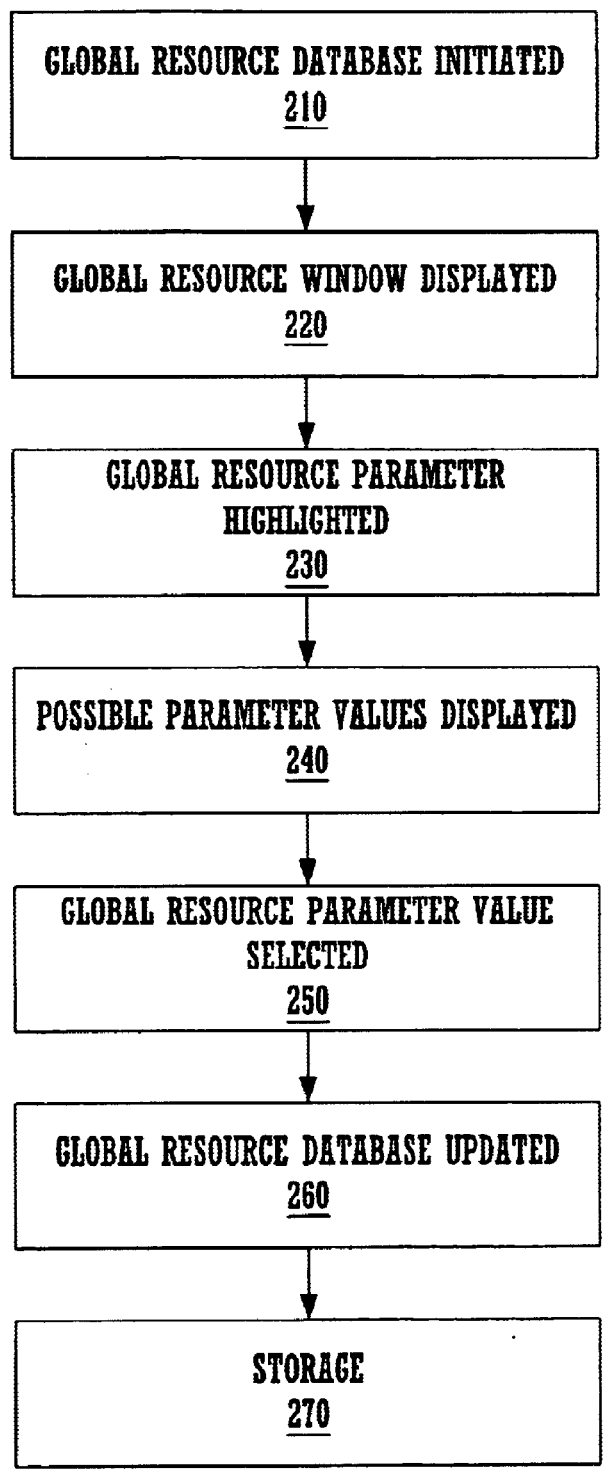
FIG. 2A illustrates a process flow diagram of one embodiment of the invention.

FIG. 2A illustrates a computer implemented process flow diagram in accordance with one embodiment of the invention. The functional blocks are not to be construed as limiting the number of functional blocks within the process flow diagrams nor to be construed as a requirement for every functional block. The blocks may be performed in a different sequence without departing from the spirit of the invention. Further, blocks may be deleted, added or combined without departing from the spirit of the invention.

FIG. 2A illustrates one embodiment illustrating the display of global resources and their associated parameter values, the display of possible parameter values of one global resource, and the selection of one of the possible parameter values as the current parameter value of one global resource. In Block 210, the global resource database is initiated. The information stored within the global resource database 110 (FIG. 1) is initialized.

In Block 220, a global resources window is graphically displayed. The global resources window includes a graphical display of the global resources and their associated parameter values. A global resource may include CPU clock speed, phase lock loop mode, sleep timer, analog power, clock divider ratio, and the like. In one embodiment, the function within the Block 220 can be performed by the global resource menu 120 (FIG. 1).

In Block 230, a global resource parameter value is highlighted or selected within the global resource window. This is performed, in one implementation, by user control. In one embodiment, the highlight or selection of the global resource parameter value is in response to the user input interface 130 (FIG. 1).

In Block 240, the possible parameter values of the global resource corresponding with the highlighted global resource parameter value are graphically displayed in a display screen, e.g., a pop up menu. The possible parameter values displayed on the pop up menu depend on the associated global resource. For example, the possible parameter values for the global resource "phase locked loop mode" is either "on" or "off". Another example, the possible parameter values for the global resource "CPU clock speed" can be a variety of numerical values and is not limited to an on or off function. Alternate integer entry is provided for numeric inputs. Direct number entry or spinner control with min/max checking is allowed, e.g., 24V1=24 MHz/N and 24V2=24 V1/N.

Further, in the Block 250, a selection of a current parameter value for the associated global resource from one of the possible parameter values also occurs. After the current parameter value is selected, the current parameter value is propagated to all hardware resources with the help of the global resource database 110.

In Block 260, the information within the global resource database 110 is updated with the current parameter values of the associated corresponding global resources.

In Block 270, current global parameter values are stored as the default global settings. The default global settings can then be recalled and associated with various other design projects without the user having to separately enter or select each parameter value.

Figure 2B:
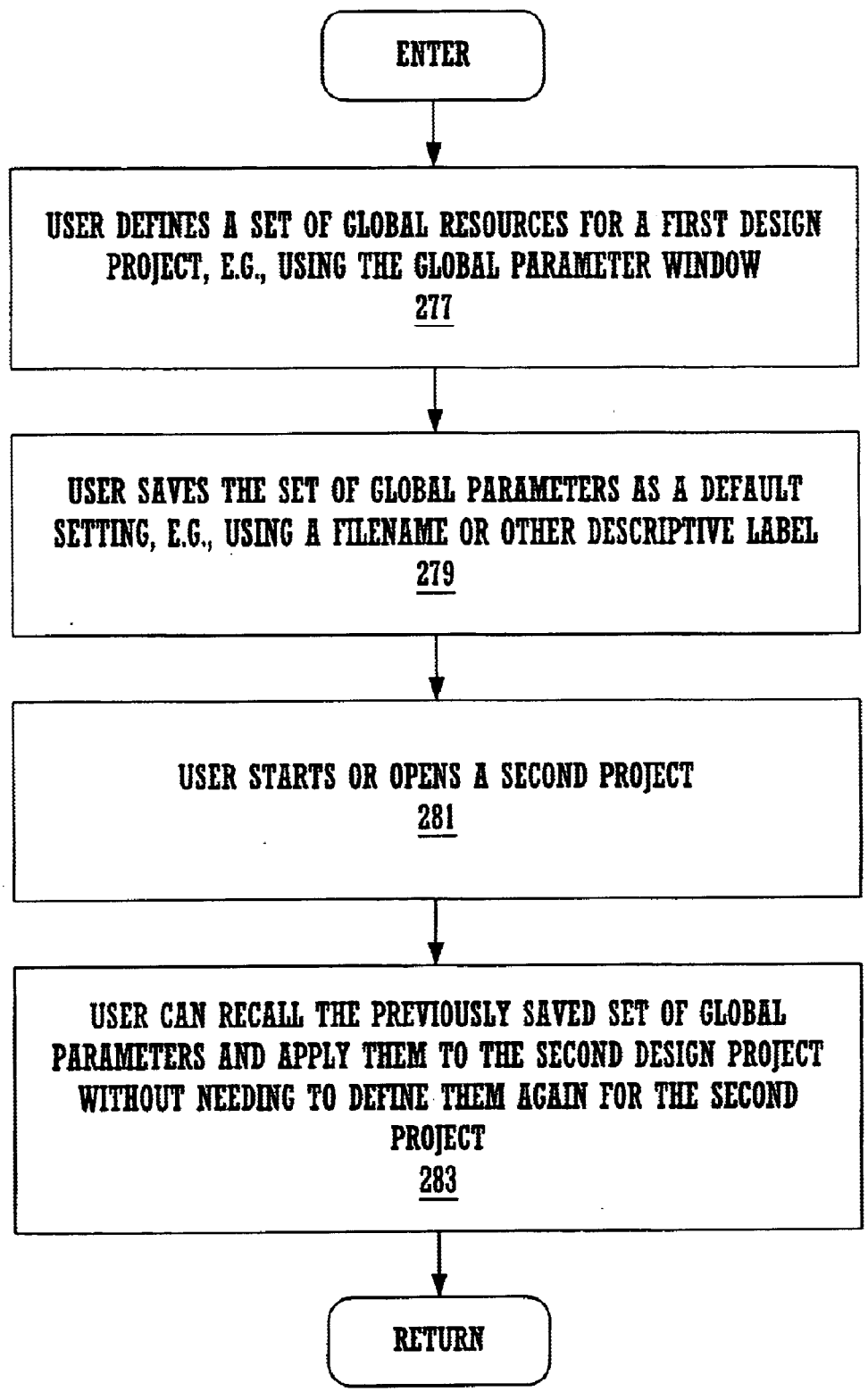
FIG. 2B illustrates a flow diagram of steps that are used to associate a set of global parameters to multiple design projects in accordance with an embodiment of the present invention.
Figure 6:
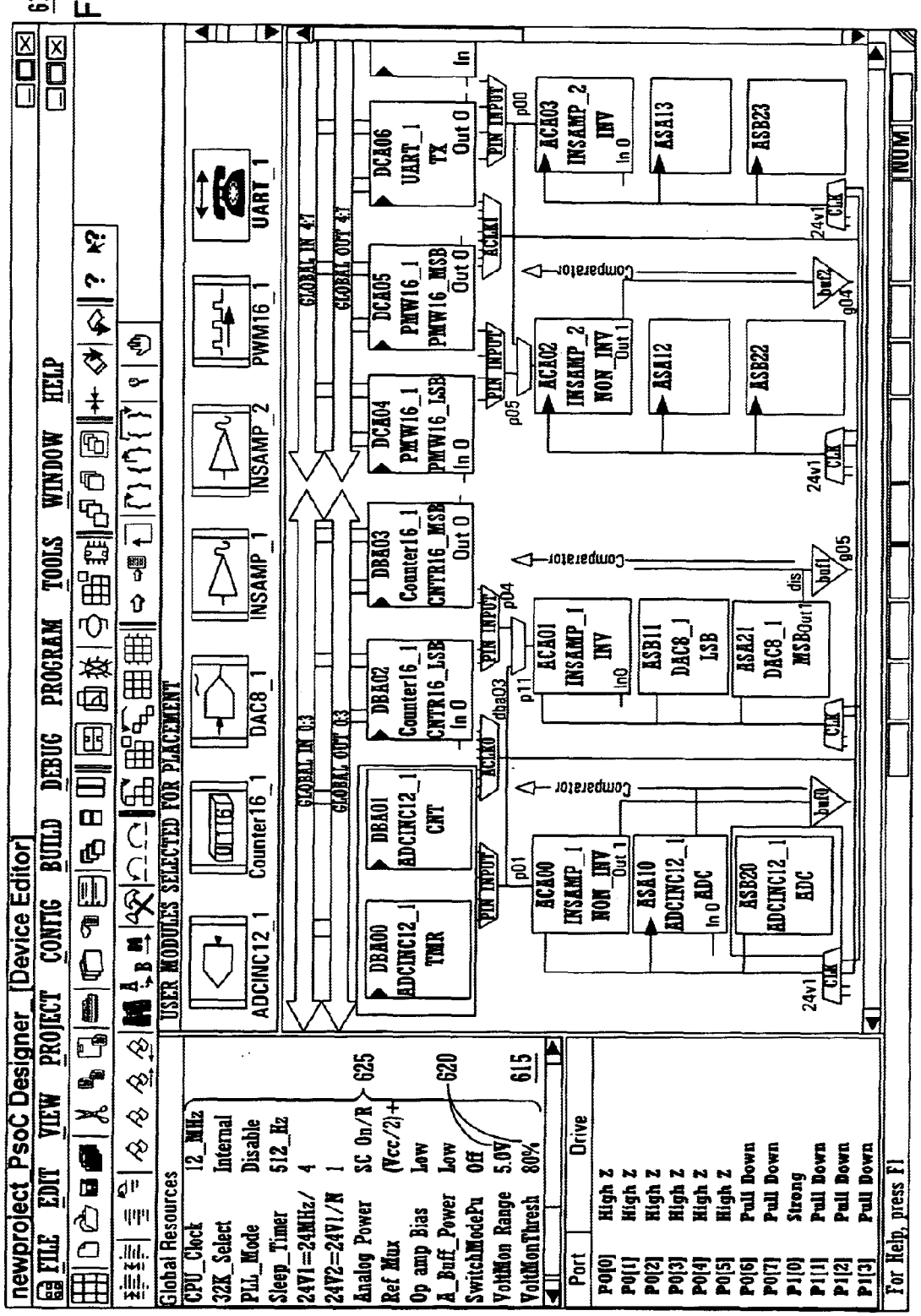
FIG. 6 illustrates an exemplary display screen from one embodiment of the invention.

FIG. 2B illustrates a computer implemented process 275 that can be used to associate a stored set of global parameter defaults with multiple design projects in accordance with an embodiment of the present invention. A design project includes a collection of user modules and placements thereof that form an electronic system when implemented on a programmable microcontroller. For instance, FIG. 6 illustrates an exemplary design project having seven selected user modules and various placements thereof within the available hardware resources. Typically, a user will assign a name to the design project for ease of manipulation and recall. As also shown in FIG. 6 is an examplary set of global resource parameters 625 that a associated with the project.

At step 277 of FIG. 2B, a user can define a set of global resource parameters for a first design project, e.g., using the global parameter window. The steps of FIG. 2A can be used to implement step 277. At step 279, the user saves the set of global parameters as a default setting. e.g., using a filename or other descriptive label. For instance, the user can assign a name to the set of saved global parameters, e.g., "Default_Set."

At step 281 of FIG. 2B, the user then starts or recalls a second design project. At step 283, the user can recall the saved set of default global parameters, e.g., "Default_Set," and apply them to the second design project thereby avoiding the problem of defining a new set of global parameters for the second design project. The user may use a graphical user interface selection technique, or a simple filename selection technique, to select the default set and apply it to the second design project.

Figure 3:
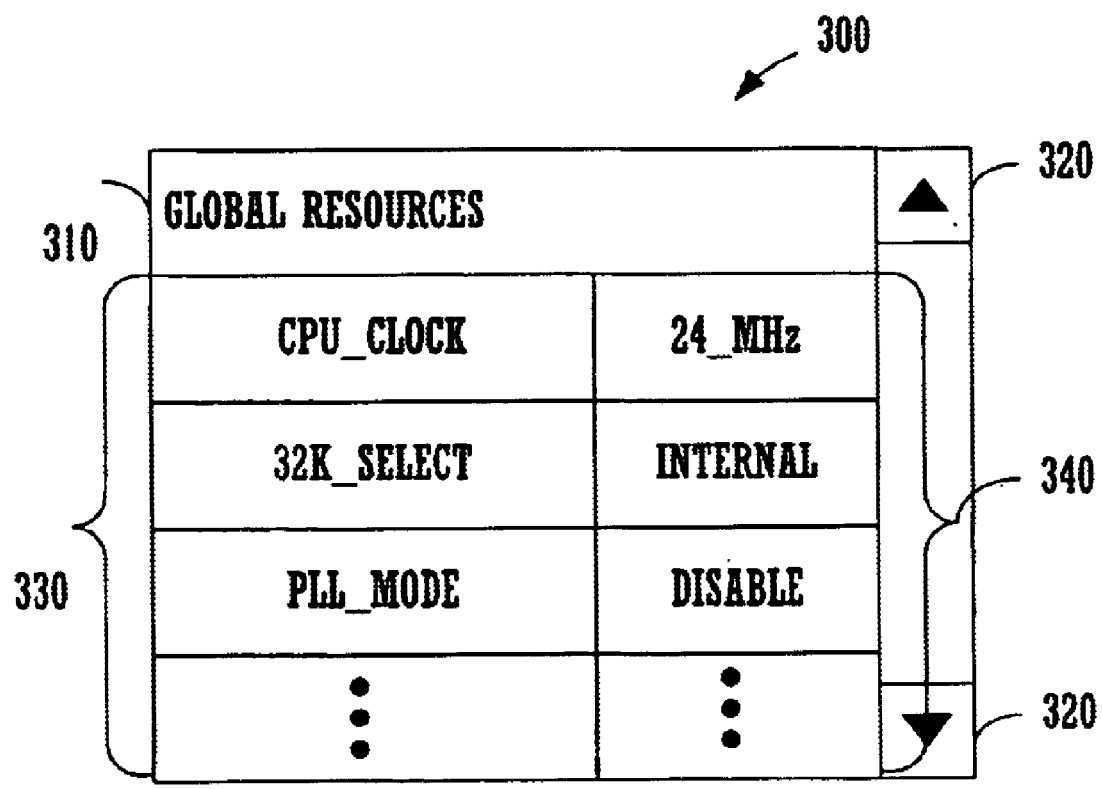
FIG. 3 illustrates a display screen of a global parameter window in accordance with one embodiment of the invention.
Figure 4:
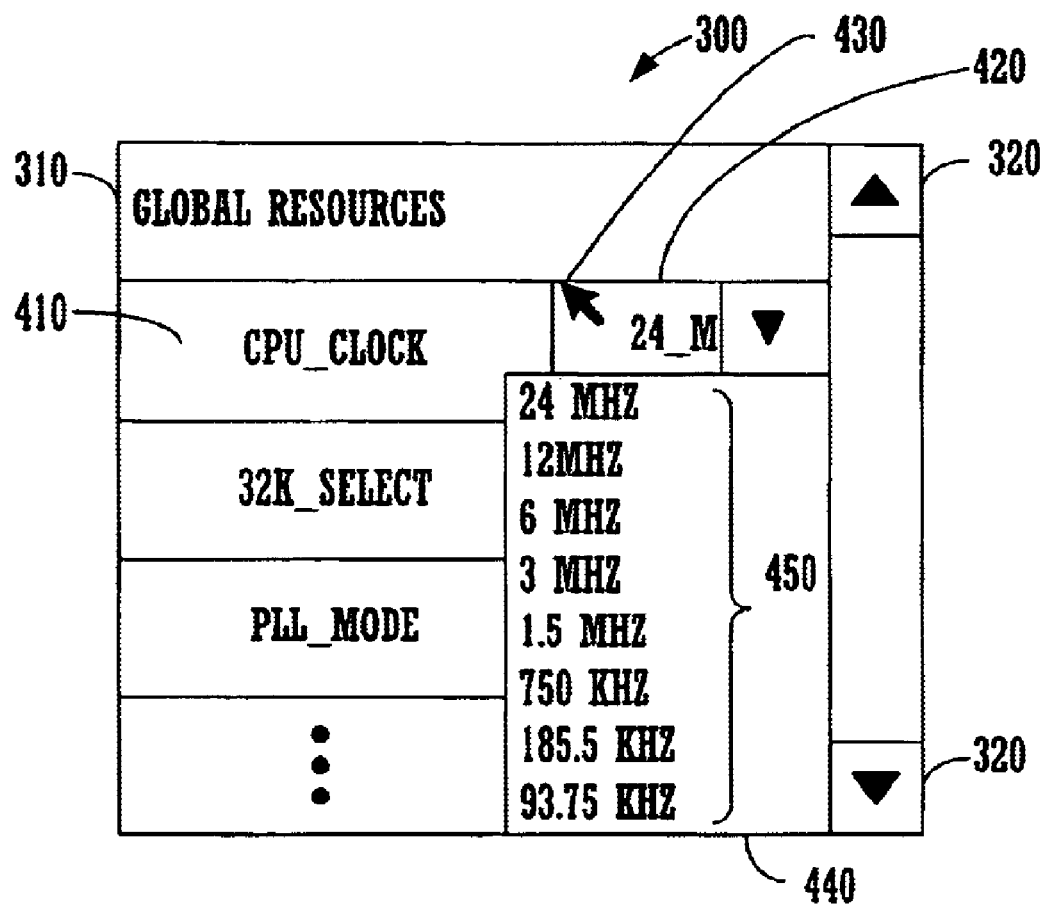
FIG. 4 illustrates a display screen of an edit session of the global parameter windows in accordance with one embodiment of the invention.
Figure 5:
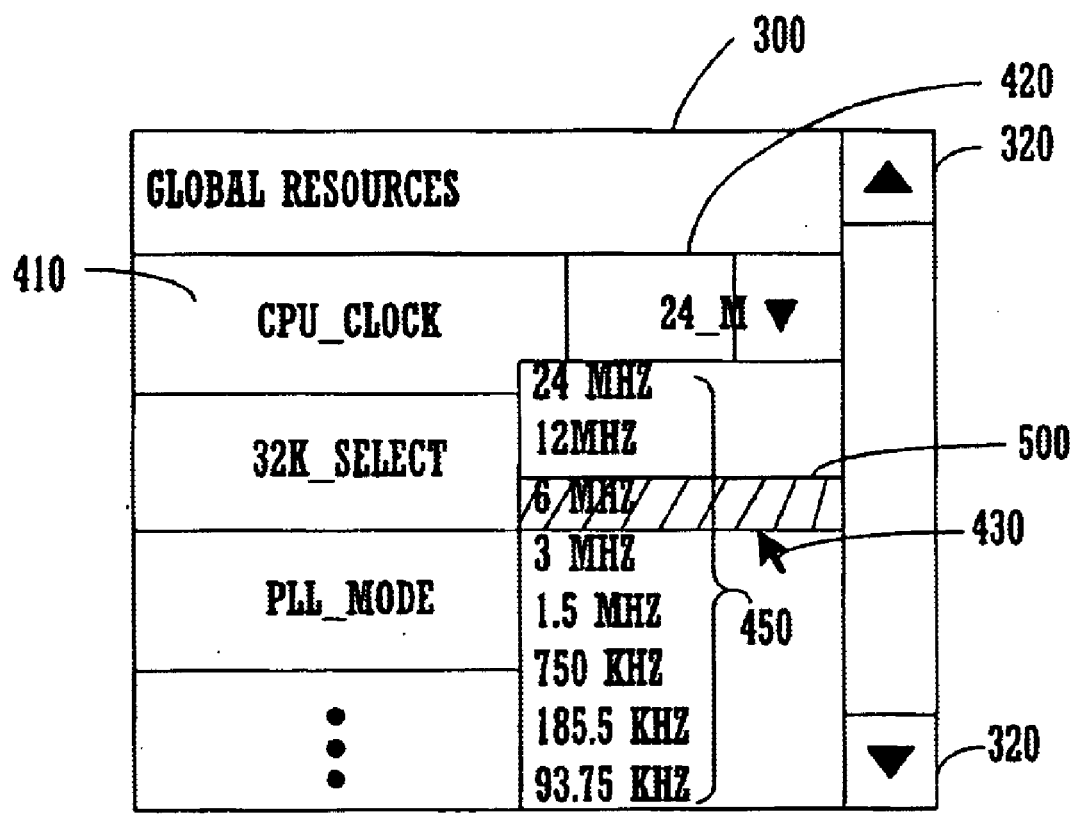
FIG. 5 illustrates an edit drop down box display screen from one embodiment of the invention.

FIGS. 3–5 each illustrate one embodiment of a display screen showing a global resources window. For the sake of clarity, common element numbers are utilized to represent similar items to avoid unnecessary confusion. For example, a global resource window 300, a heading 310, and scroll bars 320 are utilized in FIGS. 3–5 to merely illustrate a graphical representation of the general layout of the global resources and their corresponding parameter values.

FIG. 3 illustrates one embodiment showing the global resource window 300. In one embodiment, the global resource window 300 includes the header 310, the scroll bars 320, a list of global resources 330, and a list of corresponding parameter values 340. In other embodiments, the global resource window 300 can contain greater or fewer elements. In one embodiment, the header 310 is labeled as "global resources". However, in another embodiment, a different label can be used.

The list of global resources 330 is shown with multiple global resources such as CPU_CLOCK, 32K_SELECT, PLL_MODE, and the like. Additional or fewer global resources can be contained within the list of global resources 330. The list of corresponding parameter values 340 is matched with the list of global resources 330. Each value from the list of parameter values 340 is matched with a corresponding global resource. For example, the 24_MHZ value from the list of parameter values 340 corresponds with the CPU_CLOCK global resource from the list of global resources 330.

The scroll bars 320 are configured to allow scrolling through the list of global resources 330 and the list of parameter values 340.

In one embodiment, FIG. 4 illustrates a pop up menu 440 within the global resource window 300. A global resource CPU_CLOCK 410 corresponds with a 24 MHZ parameter value 420. When a cursor 430 selects the 24 MHZ parameter value 420, a pop up menu 440 is displayed. The cursor 430 functions as a pointing device and in other embodiments, can take different shapes and forms. In other embodiments, selection of the 24 MHZ parameter value 420 can be signified by graphically highlighting the parameter value 420. This highlighting can be performed by showing a grayscale shading, cross-hatching, color, or the like within the highlighted area.

Contained within the pop up menu 440 is a list of possible parameter values 450. In one embodiment, the list of possible parameter values 450 includes 24 MHZ, 12 MHZ, 6 MHZ, 3 MHZ, 1.5 MHZ, 750 KHZ, 185.5 KHZ, and 93.75 KHZ. The list of possible parameter values 450 represent the values which can be selected for the particular global resource. In another embodiment, the list of possible parameter values 450 is simply an "on" or "off" selection.

In one embodiment, FIG. 5 illustrates a selection of a parameter value within the global resource window 300. The cursor is scrolling through the list of possible parameter values 450. In one embodiment, the cursor 430 selects the 6 MHZ value 500 from the list of possible parameter values 450. To indicate the selection by the cursor 430, the 6 MHZ value 500 is highlighted. This highlighting can be performed by showing a grayscale shading, cross-hatching, color, or the like within the highlighted area.

Although not shown in FIG. 5, once the 6 MHZ value 500 has been chosen, the 24 MHZ parameter value 420 is replaced by the 6 MHZ value 500. As a result of this selection, the global resource window 300 accurately displays the CPU_CLOCK resource 410 with the corresponding 6 MHZ value 500.

FIG. 6 illustrates an example computer screen diagram 610 of a system of viewing global parameters in accordance with one embodiment of the present invention. A global resources window 615 includes a global resource column 620 and a corresponding values column 625. In one embodiment, the global resource column 620 lists the various global resources which are included such as CPU_Clock, PLL_Mode, and the like. In one embodiment, the values column 625 lists the values of the corresponding global resources. In one embodiment, the values of the CPU_Clock and PLL_Mode are 12 MHz and "disable," respectively.

Figure 7:
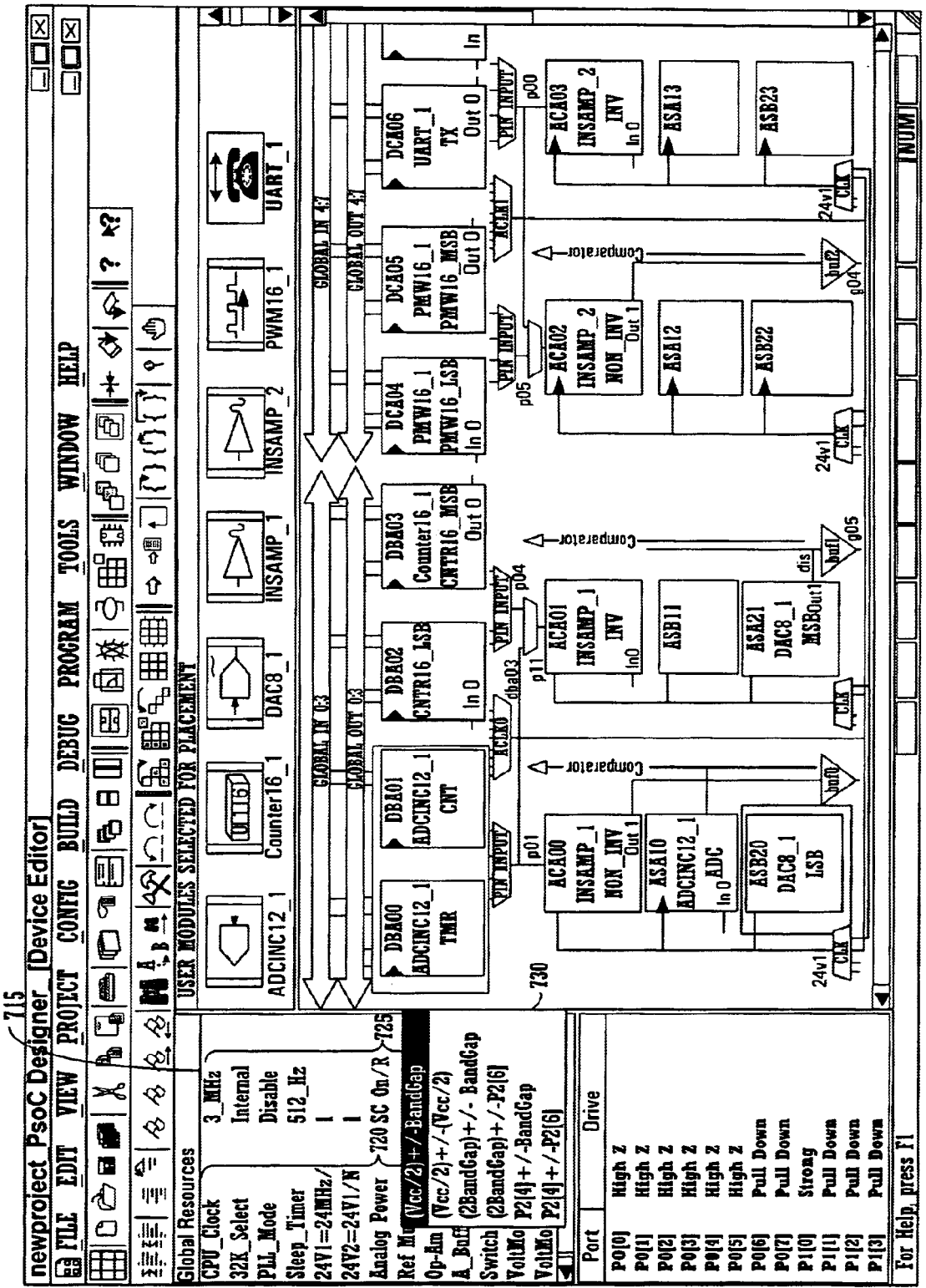
FIG. 7 illustrates an exemplary display screen showing an edit drop down box from one embodiment of the invention.

FIG. 7 illustrates an example computer screen diagram 710 of a system of viewing global parameters in accordance with one embodiment of the present invention. A global resources window 715 includes a global resource column 720 and a corresponding values column 725. In one embodiment, a pop up window 730 offers a selection of global resource values for the "Ref Mux". In one embodiment, "(Vcc/2)+/−Bandgap", "(Vcc/2)+/−(Vcc/2)", and "P2(4)+/−P2(6)" are a few of the many values that can be selected for the global resource "Ref Mux". Alternate integer entry is provided for numeric inputs. Direct number entry or spinner control with min/max checking is allowed, e.g., 24V1=24 MHz/N and 24V2=24 V1/N.

Once the values for the global resources are set, the software tool can perform the required steps to realize them across the entire system. Therefore, the programmer need not be aware of the many low level technical requirements involved in realizing these global settings or parameters. In other words, the programmer need not create separate APIs for enforcing the global parameters over all the hardware. Instead, the programmer need only interact with the global resources menu and the remainder of the propagation is performed automatically.

Further, the multiple selected parameter values can be stored as the default global settings. The default global settings can then be recalled and associated with various other projects without the user having to separately enter or select each parameter value.

The foregoing descriptions of specific embodiments of the invention have been presented for purposes of illustration and description. They are not intended to be exhaustive or to limit the invention to the precise embodiments disclosed, and naturally many modifications and variations are possible in light of the above teaching. The embodiments were chosen and described in order to explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A method comprising:
    displaying a list of parameter identifiers and respective parameter values associated therewith for use in a first electronic design project;
    highlighting via an input device a parameter value of said respective parameter values that are displayed, said parameter value corresponding to a parameter identifier of said list;
    in response to said highlighting via said input device said parameter value, displaying a plurality of possible parameter values which can be chosen for said parameter identifier;
    choosing one of the plurality of possible parameter values that are displayed as a chosen parameter value for said parameter identifier via the input device; and
    storing the chosen parameter value as a default global setting for use by a second electronic design project.

2. The method according to claim 1 further comprising applying the default global setting to the second electronic design project.

3. The method according to claim 1 wherein said displaying the plurality of possible parameter values includes displaying a pop-up list that comprises the plurality of possible parameter values.

4. The method according to claim 1 wherein said parameter identifier corresponds to a CPU clock speed or a sleep timer.

5. The method according to claim 1 wherein said parameter identifier corresponds to a phase lock loop mode.

6. The method according to claim 1 wherein said parameter identifier corresponds to a clock divider ratio or analog power.

7. A method comprising:
    displaying a list of parameter identifiers and respective parameter values associated therewith for use in a first programmable microcontroller circuit;
    highlighting a parameter value of said respective parameter values that are displayed via an input device, said parameter value corresponding to a parameter identifier of said list;
    in response to said highlighting said parameter value, displaying a window comprising a plurality of possible parameter values which can be selected for said parameter identifier;
    selecting one of the plurality of possible parameter values as a selected parameter value for the parameter identifier via the input device; and storing the selected parameter value as a default global setting for use by a second programmable microcontroller circuit.

8. The method according to claim 7 wherein the parameter identifier corresponds to a CPU clock speed or analog power.

9. The method according to claim 7 wherein the parameter identifier corresponds to a phase lock loop mode.

10. The method according to claim 7 wherein the parameter identifier corresponds to a sleep timer.

11. The method according to claim 7 wherein the parameter identifier corresponds to a clock divider ratio.

12. A system comprising:

a global resource menu configured to display a list of parameter identifiers and respective parameter values associated therewith for use in a first design project, and configured to display a plurality of possible parameter values which can be chosen for a parameter identifier of said list in response to an input device highlighting a parameter value of said respective parameter values that are displayed, and configured to allow one of the plurality of possible parameter values to be chosen as a current parameter value for said parameter identifier;

a global resource parameter selector coupled to the global resource menu and configured to set the current parameter value for an associated hardware resource; and a global resource database coupled to the global resource parameter selector for tracking a location within the associated hardware resource and for storing the current parameter value as a default setting for use in a second design project.

13. The system according to claim 12 wherein said parameter identifier corresponds to a CPU clock speed or a clock divider ratio.

14. The system according to claim 12 wherein said parameter identifier corresponds to analog power.

15. The system according to claim 12 wherein said parameter identifier corresponds to a phase lock loop mode.

16. The system according to claim 12 wherein said parameter identifier corresponds to a sleep timer.

17. In a design system for programming integrated circuits, a method comprising:

displaying, in tabular form, a list of parameter names and respective parameter values associated therewith for use in a first programmable integrated circuit;

in response to a user highlighting a parameter value of said respective parameter values that are displayed, displaying a window comprising a plurality of possible values which can be selected for a parameter name of said list;

in response to a user selection of a value of said plurality of possible values, assigning said value to said parameter name; and in response to the user selection of the value, storing said value of said parameter name to a default setting for use in a second programmable integrated circuit.

18. The method as described in claim 17 wherein said parameter name corresponds to a CPU clock speed or a clock divider ratio.

19. The method as described in claim 17 wherein said wherein said parameter name corresponds to analog power.

20. The method as described in claim 17 wherein said parameter name corresponds to a phase lock loop mode.

21. The method as described in claim 17 wherein said parameter name corresponds to a sleep timer.

22. The method as described in claim 21 wherein said window comprises a pop-up list.

23. A design system for programming integrated circuits comprising:

a processor coupled to a bus; and a memory coupled to said processor, said memory containing instructions for implementing a method comprising:

displaying, in tabular form, a list of parameter identifiers and respective parameter values associated therewith for use in a first programmable integrated circuit;

in response to a user highlighting a parameter value of said respective parameter values that are displayed, displaying a window comprising a plurality of possible values which can be chosen for a parameter identifier of said list;

in response to a user selection of a chosen value of said plurality of possible values, assigning said chosen value to said parameter identifier; and in response to the user selection of the chosen value, storing said chosen value of said parameter identifier to a default setting for use in a second programmable integrated circuit.

24. The design system as described in claim 23 wherein said parameter identifier corresponds to a CPU clock speed or a sleep timer.

25. The design system as described in claim 23 wherein said parameter identifier corresponds to a phase lock loop mode.

26. The design system as described in claim 23 wherein said parameter identifier corresponds to analog power.

27. The design system as described in claim 23 wherein said parameter identifier corresponds to a clock divider ratio.

28. The design system as described in claim 27 wherein said window comprises a pop-up list.

* * * * *